United States Patent
Wang et al.

(10) Patent No.: US 7,543,262 B2
(45) Date of Patent: Jun. 2, 2009

(54) ANALOG LAYOUT MODULE GENERATOR AND METHOD

(75) Inventors: Zhigang Wang, Sewickley, PA (US); Elias Fallon, Pittsburgh, PA (US); Regis R. Colwell, Gibsonia, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 342 days.

(21) Appl. No.: 11/295,268

(22) Filed: Dec. 6, 2005

(65) Prior Publication Data
US 2007/0130553 A1      Jun. 7, 2007

(51) Int. Cl.
*G06F 17/50*      (2006.01)
(52) U.S. Cl. ..................................... 716/11
(58) Field of Classification Search ............. 716/11
See application file for complete search history.

(56) References Cited

U.S. PATENT DOCUMENTS

| | | | | |
|---|---|---|---|---|
| 5,592,392 A * | 1/1997 | Matheson et al. | ............. | 716/11 |
| 5,920,486 A * | 7/1999 | Beahm et al. | ................. | 716/10 |
| 6,064,806 A * | 5/2000 | Lakos et al. | .................... | 716/3 |
| 6,077,308 A * | 6/2000 | Carter et al. | .................... | 716/8 |
| 6,321,367 B1 * | 11/2001 | Chun et al. | ..................... | 716/8 |
| 6,324,678 B1 * | 11/2001 | Dangelo et al. | ............... | 716/18 |
| 6,529,913 B1 * | 3/2003 | Doig et al. | .................... | 707/101 |
| 6,564,365 B1 * | 5/2003 | Argyres | ......................... | 716/11 |
| 6,684,376 B1 * | 1/2004 | Kerzman et al. | ............... | 716/8 |
| 6,738,957 B2 * | 5/2004 | Gont et al. | ..................... | 716/11 |
| 2005/0268269 A1 * | 12/2005 | Coiley | .......................... | 716/11 |
| 2006/0136856 A1 * | 6/2006 | Tang et al. | ..................... | 716/11 |
| 2007/0130553 A1 * | 6/2007 | Wang et al. | .................... | 716/11 |

\* cited by examiner

*Primary Examiner*—Stacy A Whitmore
(74) *Attorney, Agent, or Firm*—The Webb Law Firm

(57) ABSTRACT

In a computer implemented method of device layout in an integrated circuit design an array having a plurality of cells is selected and stored in a memory of a computer. A schematic view of a plurality of interconnected circuit devices of a circuit is displayed on the computer's display. One or more of the circuit devices of the displayed schematic view are selected by a user. Responsive to the selection of each circuit device, a processing means of the computer populates an empty cell of the array in the memory of the computer with a corresponding layout instance of the circuit device, wherein each layout instance represents a physical arrangement of material(s) that form the corresponding selected circuit device.

24 Claims, 13 Drawing Sheets

ANALOG LAYOUT MODULE GENERATOR AND METHOD

BACKGROUND OF THE INVENTION

1. Field of the Invention

The present invention relates to the physical design of integrated circuits, especially analog integrated circuits, and more particularly, to the improved automation of integrated circuit design.

2. Description of Related Art

Heretofore, the physical design of integrated circuits (ICs), especially Analog ICs, was a time-consuming and labor-intensive task. The complexity of analog circuit layout comes from the extreme sensitivity of the continuous analog signal over the device interaction, fabrication process and operating environment, which require fine tuning of the physical circuit layout. To minimize these degrading influences on IC performance, analog layout engineers adopt various geometrical techniques such as, without limitation: interdigitation, device merging, matching, symmetrical layout, guard ring protection, etc. How these techniques are applied to the layout is mostly dependent on the designer's experience. Multiple iterations between simulation, schematic design and layout design are common practice to meet the design specification.

Physical circuit layout is not usually done from scratch, but instead using a hierarchical design library of scalable components and different types of "sub circuits," thereby saving a great deal of labor. A "sub circuit" is a fragment of a circuit that has defined interface nodes (or equivalently, "terminals" or "pins") to other circuits or other sub circuits, that may occur repeatedly, sometimes with different component scaling, in a circuit design. Sub circuits may be more or less complex. Examples of sub circuits that an analog or mixed-signal circuit designer may deal with at low-levels can include, without limitation: differential transistor pairs; parallel connections of transistors in different common node configurations (e.g., common gate, source, or drain configuration for field effect transistors "FETs"; or common emitter, base, or collector configuration for bipolar junction transistors "BJTs"); cascode transistor pairs; current mirrors; cascode current mirrors; and the like.

The general approach of layout generation is, first partition the schematic into predefined more or less complex modules, then place and route these modules by deterministic or non-linear optimization algorithms. In the common analog design methodology, dedicated module libraries or module generators are used to create layout instances. Although the number of module types is usually limited in the analog design domain (for example, current mirror, differential pair, diode-connected transistor, etc.), the creation of technology-independent parameterized modules is very complicated and time-consuming. The difficulty comes from the great number of variants of the modules' layout topology, connectivity, technology dependency, and device dimension. It is not unusual to find hundreds of parameter settings or complex language programming needed for module generation tools. The steep learning curve and low maintainability seriously limit the adoption of those tools in industry.

It would, therefore, be desirable to overcome the above problem(s) and others by providing an apparatus and method to generate circuit (or sub circuit) designs more easily and efficiently and to be able to reuse such circuit designs more readily.

SUMMARY OF THE INVENTION

The invention is a computer implemented method of device layout in an integrated circuit design comprising (a) providing an array having a selectable number of rows and columns of cells; (b) displaying on a display of the computer a schematic view of a plurality of interconnected circuit devices comprising a circuit; and (c) populating an empty cell of the array with a corresponding layout instance of a circuit device upon selection of the circuit device in the schematic view, wherein each layout instance represents a physical arrangement of material(s) that form the corresponding selected circuit device.

The plurality of circuit devices displayed in the schematic view can include one or more transistors, one or more capacitors and/or one or more resistors.

The method can include populating one or more of the cells of the array as a function of a selected interdigitation pattern.

The method can further include displaying the array including the layout instance of a selected circuit device in at least one cell thereof on the display. A layout instance in the displayed array can be moved from one cell in the array to another cell in the array via an input/output system of the computer.

At least one electrical connection can be routed between at least two terminals of the layout instances populating the array based on one or more predetermined routing rules selected via the input/output system of the computer. An electrical distribution network can be formed in proximity to the layout instances populating the array based on one or more predetermined routing rules selected via the input/output system of the computer.

The array can include at least one unpopulated cell when all of the desired layout instances have been populated into the array.

All of the layout instances in the array can be aligned to the top, center or bottom of their respective cells via a selection made via an input/output system of the computer. A rotational orientation of at least one layout instance in its respective cell can be changed via a selection made via the input/output system of the computer. A rotational orientation of the populated array can be changed via a selection made via the input/output system of the computer. Layout instances in two or more adjacent cells can be caused to abut or unabut via a selection made via the input/output system of the computer.

At least one dummy row or column can be inserted adjacent a row or column of the array at the periphery of the array. Each cell of the inserted dummy row or column can be populated with either the layout instance of the cell in the adjacent row or column or a user selected layout instance.

At least one terminal of each layout instance populating a dummy row or column can be connected to an electrical distribution network formed in proximity to the array via a selection made via an input/output system of the computer, wherein the electrical distribution network is configured to distribute either electrical power or a ground reference.

A body contact can be inserted adjacent each of one or more sides of a layout instance.

A guard ring can be formed around the array in contact with a ground reference.

The invention is also an apparatus for laying out devices of an integrated circuit design. The apparatus includes means for selecting a desired x-y array of cells and means for displaying a diagrammatic view of a plurality of interconnected circuit devices. Means is/are provided for enabling a user to select a plurality of the circuit devices in the diagrammatic view. Means responsive to the selection of the plurality of circuit devices in the diagrammatic view is/are provided for populating each of a like plurality of empty cells of the array with a layout instance of one of the selected circuit devices, wherein, each layout instance represents a physical arrangement of material(s) that form the corresponding selected circuit device.

The apparatus can include means for selecting an interdigitation pattern for layout instances of the array. The means for populating can populate one or more of the cells of the array as a function of the selected interdigitation pattern.

The circuit devices displayed in the diagrammatic view can include one or more transistors, one or more capacitors and/or one or more resistors.

The apparatus can include means for displaying the array with at least one cell thereof including a layout instance of a selected circuit device.

The apparatus can include means for moving a layout instance in the displayed array from one cell of the array to another cell of the array.

The apparatus can include means for routing at least one electrical connection between at least two terminals of the layout instances populating the array based on one or more routing rules and/or means for forming an electrical distribution network in proximity to the array.

The array can include at least one unpopulated cell when all of the desired layout instances have been populated into the array.

The apparatus can include means for aligning all of the layout instances to the top, center or bottom of their respective cells; means for rotating at least one layout instance in its respective cell; means for rotating the populated array; and/or means for abutting or unabutting layout instances in two or more adjacent cells.

The apparatus can include means for inserting at least one dummy row or column adjacent a row or column of the array at the periphery of the array and means for populating each cell of the inserted dummy row or column with either the layout instance of the cell in the adjacent row or column or a user selected layout instance.

The apparatus can include means for connecting at least one terminal of each layout instance populating a dummy row or column to an electrical distribution network formed in proximity to the array, wherein the electrical distribution network is configured to distribute either electrical power or a ground reference.

The apparatus can include means for inserting a body contact adjacent each of one or more sides of a layout instance.

The apparatus can include means for forming a guard ring around the array and means for connecting the guard ring to an electrical distribution network configured to distribute a ground reference.

DETAILED DESCRIPTION OF THE INVENTION

The present invention will be described with reference to the accompanying figures where like reference numbers correspond to like elements.

Figure 1:
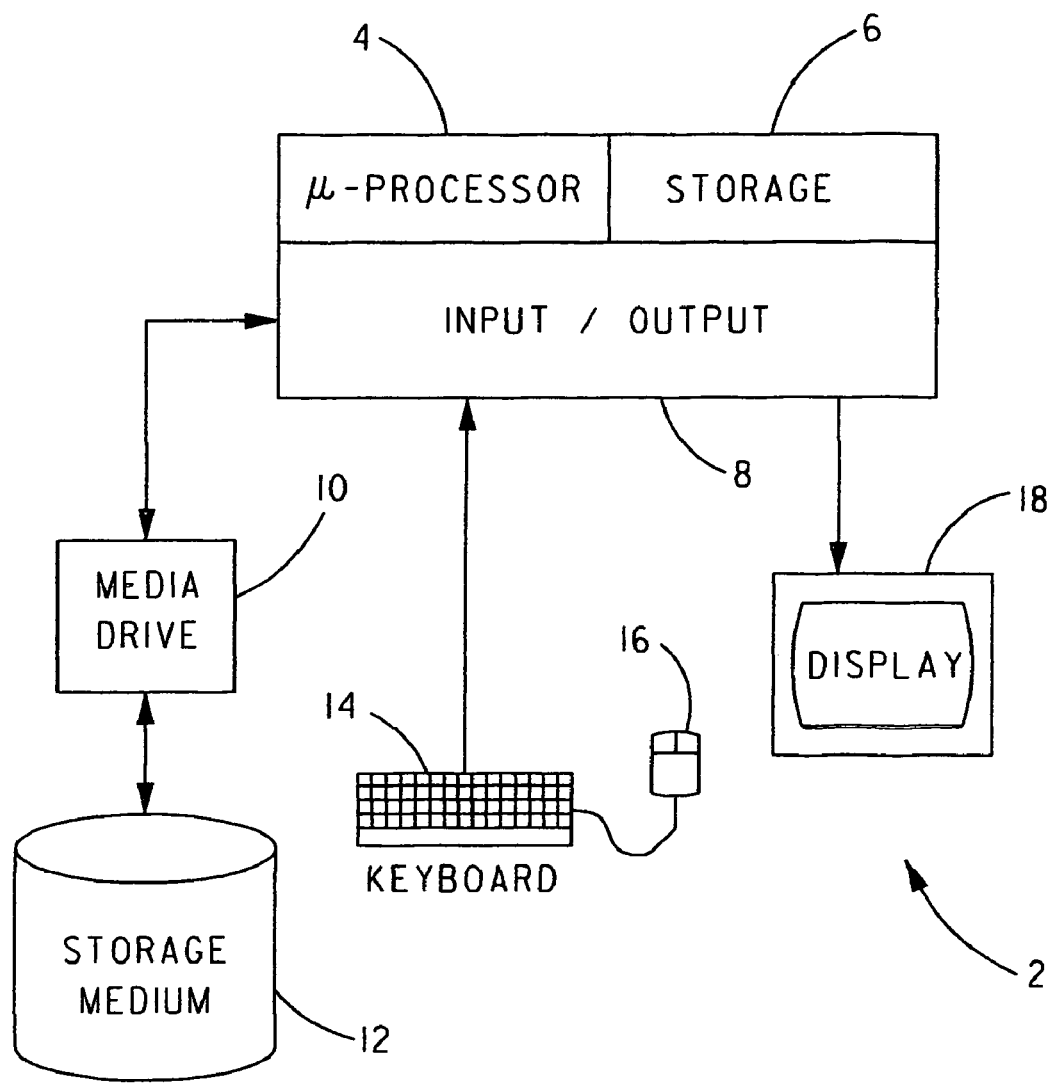
FIG. 1 is a block diagram of an exemplary computer which can execute computer software that embodies the present invention.

With reference to FIG. 1, the present invention is embodied in computer software which executes on one or more standalone or networked computers 2. Each computer 2 includes a microprocessor 4, a computer storage 6 and an input/output system 8. Each computer 2 can also include a media drive 10, such as a disk drive, CD ROM drive, and the like. Media drive 10 can operate with a computer readable storage medium 12 capable of storing the computer software that embodies the present invention, which computer software is able to configure and operate computer 2 in a manner to implement the present invention. Input/output system 8 can include a keyboard 14, a mouse 16 and/or a display 18. Computer 2 is exemplary of computers capable of executing the computer software of the present invention and is not to be construed as limiting the invention.

Figure 2:
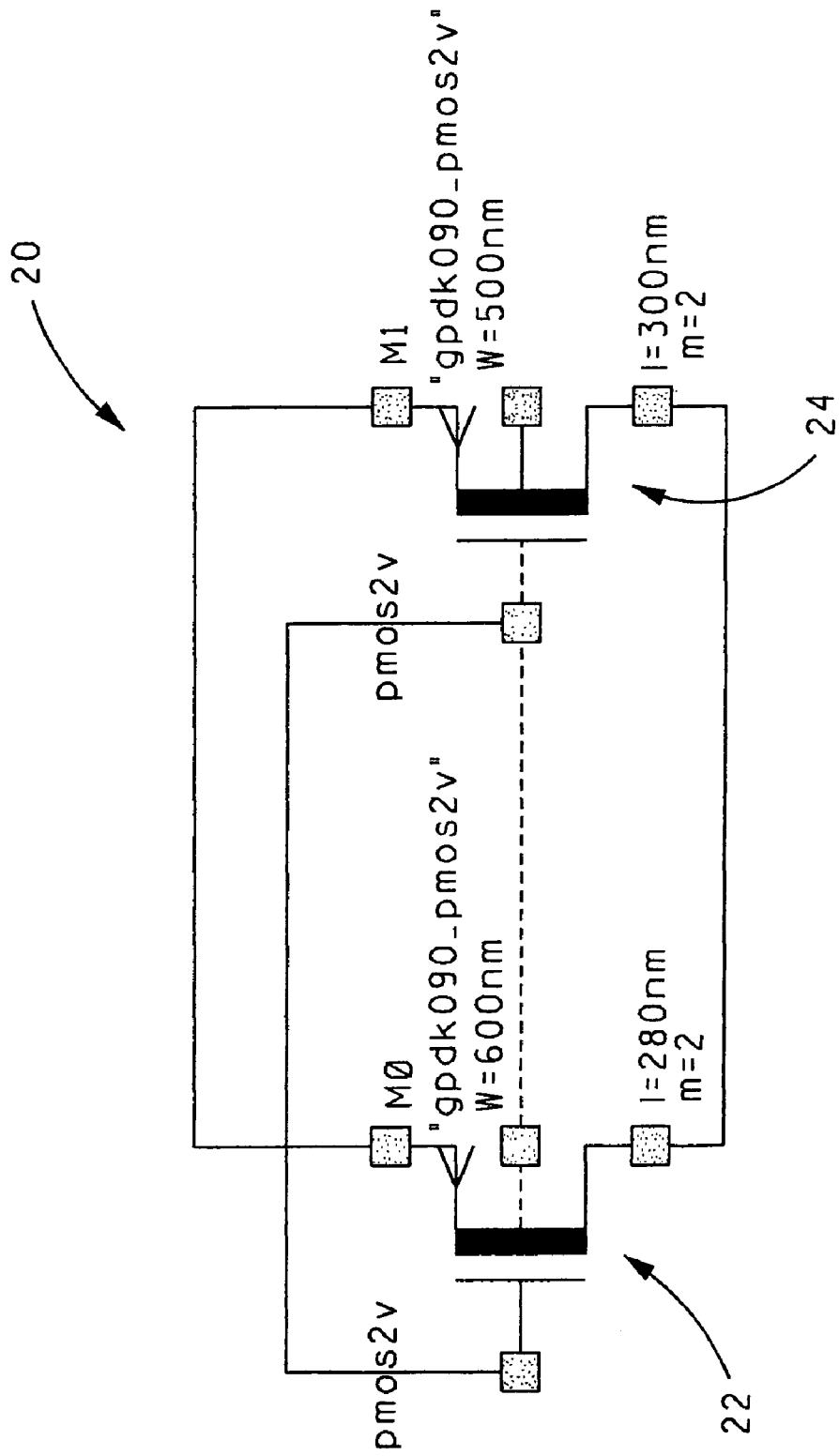
FIG. 2 is a schematic or diagrammatic view of a circuit that can be displayed on the display of the computer of FIG. 1 under the control of the computer software of the present invention, wherein the computer software of the present invention enables each circuit device of the circuit to be selected via the keyboard and/or mouse of the computer of FIG. 1.

With reference to FIG. 2 and with continuing reference to FIG. 1, desirably, the computer software embodying the present invention (hereinafter "the computer software of the present invention") is an application program that is capable of configuring and operating computer 2 in a manner that enables a user to selectively import into storage 6 a file containing a schematic view of a circuit that includes a plurality of interconnected circuit devices. As used herein, the term "circuit" means a complete circuit or a subset of a complete circuit.

Once the file containing the schematic view of the circuit has been imported into storage 6, microprocessor 4 causes the schematic view of the circuit to be displayed on display 18 under the control of the computer software of the present invention. An exemplary schematic view of a circuit 20 that can be displayed on display 18 is shown in FIG. 2, wherein circuit 20 includes a first transistor 22 and a second transistor 24 connected as shown.

Figure 3:
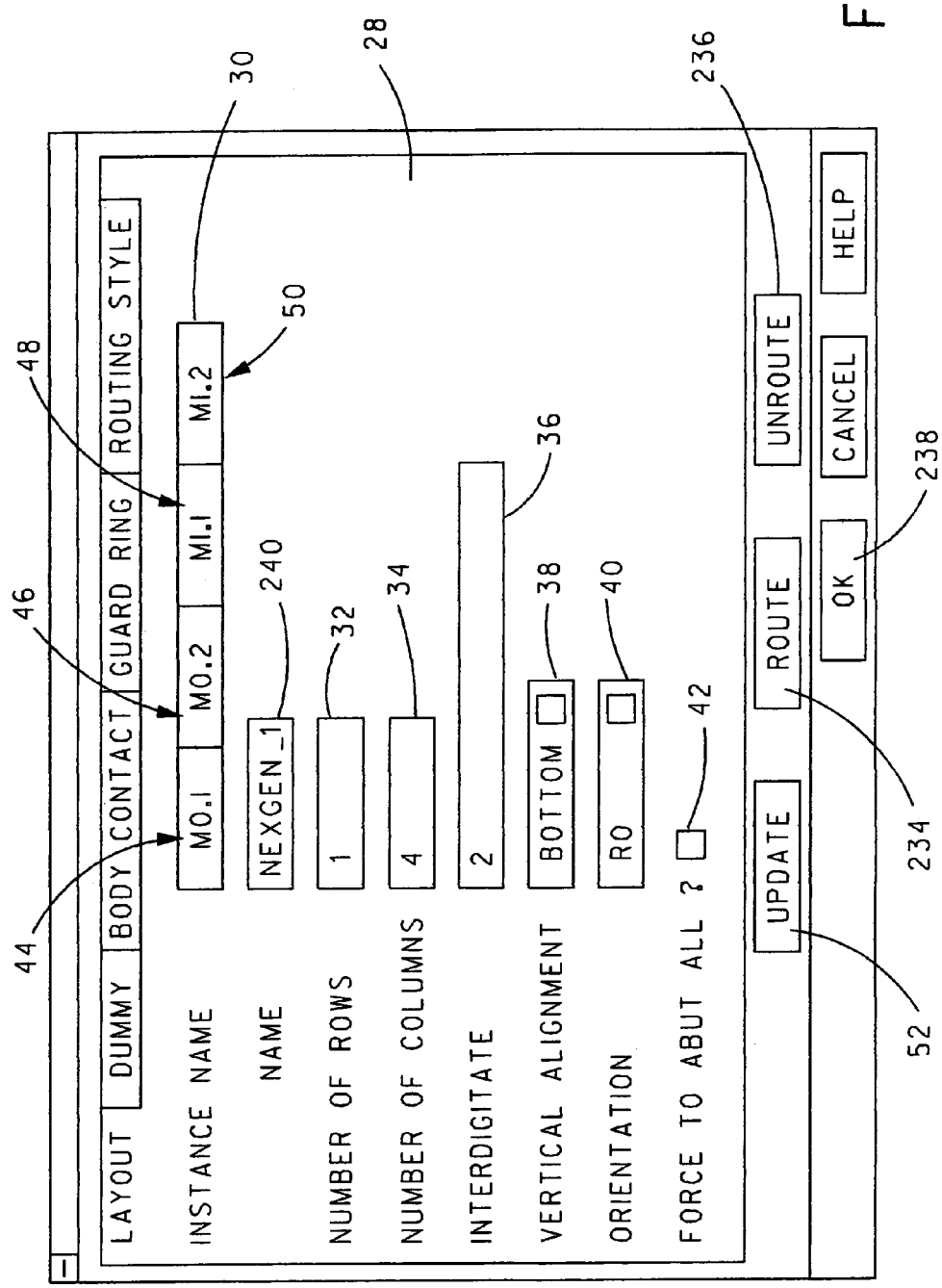
FIG. 3 is a layout dialog box that can be displayed on the display of the computer of FIG. 1 under the control of the computer software of the present invention in connection with the circuit shown in FIG. 2.

With reference to FIG. 3 and with continuing reference to all previous figures, the computer software of the present invention enables a user thereof to display a "Layout" dialog box 28 on display 18 in a manner known in the art via input/output system 8. Layout dialog box 28 includes an "instance name" text box 30, a "number of rows" text box 32, a "number of columns" text box 34 and an "interdigitate" text box 36. Layout dialog box 28 also includes a "vertical alignment" pull down menu button 38 and an "orientation" pull down menu button 40. Lastly, layout dialog box 28 includes a "forced to abut all?" check box 42.

The interaction between the schematic view of circuit 20 shown in FIG. 2 and layout dialog box 28 shown in FIG. 3 will now be described.

At a suitable time, a user utilizing input/output system 8 selects transistor 22 in any suitable manner, e.g., the point and click method via mouse 16 and display 18. In FIG. 2, transistor 22 is denoted as transistor M0 having a width (w)=600 nm, a length (l)=280 nm and a variable "m"=2 which corresponds to the number of layout instances (discussed hereinafter) of transistor 22 that are needed to actualize the functionality of transistor 22 in the final design. Similarly, transistor 24 includes the following variables: w=500 nm, l=300 nm and m=2 corresponding to like named variables associated with transistor 22.

In response to the user selecting transistor 22 in FIG. 2, text box 30 in FIG. 3 is automatically populated by the computer software of the present invention with a data pointer 44 (M0.1), corresponding to the first instance of transistor of M0, and with a data pointer 46 (M0.2), corresponding to the second instance of transistor M0.

Thereafter, in response to the user selection of transistor 24 in FIG. 2, text box 30 in FIG. 3 is automatically populated by the computer software of the present invention with a data pointer 48 (M1.1), corresponding to the first instance of transistor M1, and with a data pointer 50 (M1.2), corresponding to the second instance of transistor M1. The process of selecting circuit devices, such as one or more transistors, one or more capacitors (not shown) and/or one or more resistors (not shown) in the schematic view of a circuit by the user, and the resultant entry of corresponding data pointers in text box 30 by the computer software of the present invention in response to said user selection can continue until desired number of circuit devices have been selected.

In the present example, since m=2 for transistor 22 and transistor 24, two data pointers instances of each transistor are entered automatically into text box 30 in response to selection of the transistor by the user. The value of m=2 in the present example, however, is not to be construed as limiting the invention since the value of m can be set to any suitable and/or desirable value. Likewise, the width (w) and length (l) of each transistor can be selected by the user in any suitable or desirable manner. Similar comments apply in respect of the width, length and number of instances of one or more capacitors, one or more resistors, etc. of the circuit. For simplicity of illustration and discussion, only transistors 22 and 24 are shown. However, it is to be appreciated that one or more capacitors, one or more resistors, and/or one or more of any suitable and/or desirable circuit devices of a circuit to be realized as an integrated circuit can also appear on the schematic view of the circuit.

At a suitable time, the user can select the size of an array to be populated with layout instances of the circuit devices pointed to by the data pointers populating text box 30. In order to accomplish this, the user enters into text box 32 the desired number of rows of the array and enters into text box 34 of the desired number of columns of the array.

The user can enter into text box 36 any desired number for the interdigitation pattern of the layout instances of the circuit devices pointed to by data pointers populating text box 30. Pull down menu 38 includes a list of user selectable vertical alignments for layout instances of the devices pointed to by the data pointers populating text box 30. Suitable selections in pull down menu 38 can include: bottom, center and top. Desirably, bottom vertical alignment is the default alignment for all of the layout instances pointed to by the data pointers populating text box 30.

Pull down menu 40 includes a number of user selectable orientations for either the entire array (described hereinafter) or for each layout instance inserted into a cell of the array. Non-limiting examples of user selectable orientations include rotating either the array or the layout instance of a circuit device in the cell of the array clockwise or counterclockwise by some multiple of 90°, e.g., 90°, 180°, and 270°; rotating the entire array or a selected instance of a circuit device populating a cell of the array around its corresponding X or Y axis thereby creating a mirror image of the array or the layout instance; or combinations of rotating the array or a layout instance of a circuit device in a cell of the array around the X or Y axis and rotating either the array or the layout instance of a circuit device in the cell of the array clockwise or counterclockwise by some multiple of 90°.

Lastly, check box 42 of dialog box 28 can be selected or unselected to cause adjacent lay-down instances of circuit devices populating the cells of the array to abut or unabut.

Figure 4:
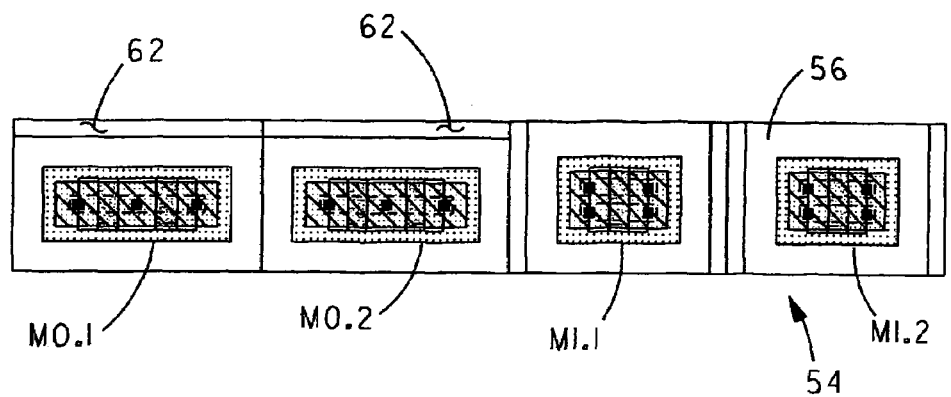
FIGS. 4-5 are different layout views of layout instances of the circuit devices of the circuit of FIG. 2, wherein each layout view includes an array having cells populated with the layout instances of the circuit devices of the circuit of FIG. 2, that can be formed via the layout dialog box of FIG. 3.

With reference to FIG. 4 and with continuing reference to all previous figures, once each of text boxes 30-36 have been populated with user desired data, the appropriate selections have been made in pull down menus 38 and 40 and check box 42 has either been selected or unselected, as desired, the user can select update button 52 whereupon the computer software of the present invention creates in storage 6 an array 54 of cells 56 having the number of rows and the number of columns entered into text boxes 32 and 34.

The cells 56 of array 54 are populated from left-to-right and, where an array has two or more rows, from top-to-bottom, with layout instances of circuit devices pointed to by the data pointers populating text box 30 in the listed order from left-to-right. For example, since data pointer 44 points to a first instance of a layout instance of transistor M0, and since data pointer 44 is the first data pointer in the list of data pointers populating text box 30, a first layout instance of transistor M0, i.e., M0.1, is input into the left-most cell 56 of array 54 automatically by the computer software of the present invention. Since data pointer 46 is the second data pointer in the list of data pointers populating text box 30 and since, in the present example, data pointer 46 points to the second layout instance of transistor M0, the second instance of transistor M0, i.e., M0.2, is input into the second cell of array 54. Similar comments apply in respect of the first and second layout instances of transistor M1, i.e., M1.1 and M1.2, input into the third and fourth cells 56 of array 54.

Desirably, the computer software of the present invention is configured so that if the number included in interdigitate text box 36 is entered prior to the selection of transistor M0 or M1 in the schematic of the circuit shown in FIG. 2, the interdigitation pattern specified by the data populating text box 36 is represented by the order that data pointers 44-50 are entered into text box 30.

The interdigitation pattern of "2" entered into text box 36 is clearly seen in FIG. 4 wherein the first and second layout instances of transistor M0 are adjacent each other in the two left-most cells 56 of array 54 while the first and second layout instances of transistor M1 are adjacent each other in the two right-most cells 56 of array 54. In contrast, where the number "1" is entered into interdigitate text box 36, i.e., the default interdigitation pattern, the position of data pointers 46 and 48 in text box 30 would be reversed and the positions of the layout instances of transistors M0.2 and M1.1 in array 56 would also be reversed.

Each data pointer 44-50 included in text box 30 points to a location in storage 6, media drive 10 and/or storage medium 12 where a file that contains the data for the corresponding layout instance of the circuit device can be retrieved by the computer software of the present invention. In one non-limiting embodiment, the file for each instance of a circuit device included in the schematic view of the circuit resides in the file that contains the schematic view of circuit 20 that is utilized by the computer software of the present invention to generate said schematic view of circuit 20. However, this is not to be construed as limiting the invention since the file containing the data for each layout instance of each circuit device of the schematic view of the circuit can be included in any suitable and/or desirable location in storage 6, media drive 10 and/or storage medium 12.

Figure 5:
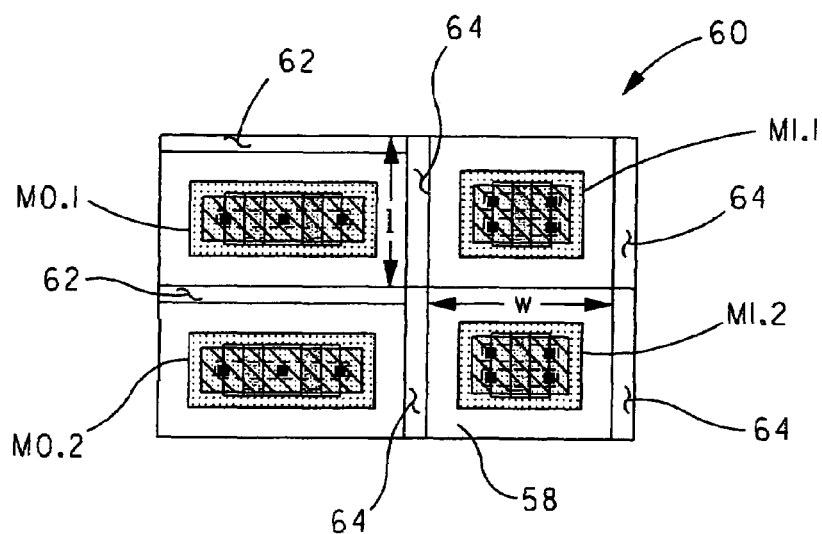

With reference to FIG. 5 and with continuing reference to FIGS. 1-4, suppose "2" is entered into each text box 32 and 34 and "1" is entered into text box 36 prior to the selection of transistors 22 and 24 of the schematic view of the circuit shown in FIG. 2. Thereafter, once transistors 22 and 24 have been selected in the schematic view of circuit 20 in FIG. 2, in response to selecting update button 52, the computer software of the present invention automatically forms the cells 58 of an array 60 and populates said cells 58 in the manner shown in FIG. 5.

The size of each cell 56 in array 54 or the size of each cell 58 in array 60 is automatically selected by the computer software of the present invention to be of sufficient size to accommodate the largest X and Y dimensions of the layout instances of the circuit devices included in the cells of the array. For example, the data included adjacent each transistor 22 and 24 of the schematic view of circuit 20 shown in FIG. 2 is included in the file pointed to by the data pointer included in text box 30 of layout dialog box 28. Desirably, the name of the file pointed to by each file is included adjacent the corresponding circuit device. For example, the file name "gpdk090_pmos2v" adjacent transistor 22 is the name of the file that contains the data for each layout instance of transistor M0. Utilizing the length (l) and width (w) information available for each transistor 22 and 24, the computer software of the present invention can generate cells of appropriate size for the array. For example, the computer software of the present invention takes the largest width of transistor 22 or 24 (in this case w=600 nm) and the longest length of transistor 22 or 24 (in this case l=300 nm) and generates each cell of each array with this width and length. Thus, as shown in FIGS. 4 and 5, the width of each transistor M0 fills the width of the corresponding cell, but the height of each transistor M0 is less than the height of the corresponding cell when bottom vertical alignment is selected in pull down menu 38 of layout dialog box 28. Thus, for each layout instance of transistor M0 in FIGS. 4 and 5, a gap 62 exists at the top of each cell where the layout instance of the corresponding transistor M0 does not fill said cell. Since the length l of each cell containing an instance of transistor M0 is 300 nm and since the length l of each layout instance of transistor M0 is 280 nm, the size of each gap 62 is the difference between 300 nm and 280 nm, or 20 nm.

Similarly, since the width of each cell equals 600 nm and since the width of each transistor M1 is 500 nm, each cell of arrays 54 and 60 having a layout instance of transistor M1 therein includes a gap 64 on either side of said layout instance. Gap 64 on each side of each layout instance of transistor M1 result from the default center horizontal alignment of the layout instance of transistor M1. Since each transistor M1 has a width of 500 nm and since the width of the cell receiving the layout instance of each transistor M1 has a width of 600 nm, each gap has a width of 50 nm, i.e., one-half of 600 nm–500 nm.

Assuming that array 54 is created and populated in response to the user selecting update button 52, the data comprising array 54 can be retained in storage 6, media drive 10, and/or storage medium 12 without being displayed on display 18. However, if desired, array 54 can be displayed on display 18 in another window than the schematic view shown in FIG. 2.

It is not necessary when selecting transistor 22 and transistor 24 that layout dialog box 28 be visible. To this end, text box 30 of layout dialog box 28 can be populated in response to the user selecting transistor 22 and transistor 24 without the need to display layout dialog box 28 at the time the selection is made. However, layout dialog box 28 can be displayed at any time in any suitable and/or desirable manner to facilitate the entry of data in text boxes 32-36, the selection of items from pull down menus 38 and 40, and the selection or unselection of check box 42. While the entry of data into text box 30 has been described in connection with the selection of transistors 22 and 24 in FIG. 2, the entry of data pointers into text box 30 can also or alternatively be accomplished by the user entering one or more data pointers 44, 46, 48 and/or 50 directly into text box 30, e.g., via keyboard 14.

Figure 6:
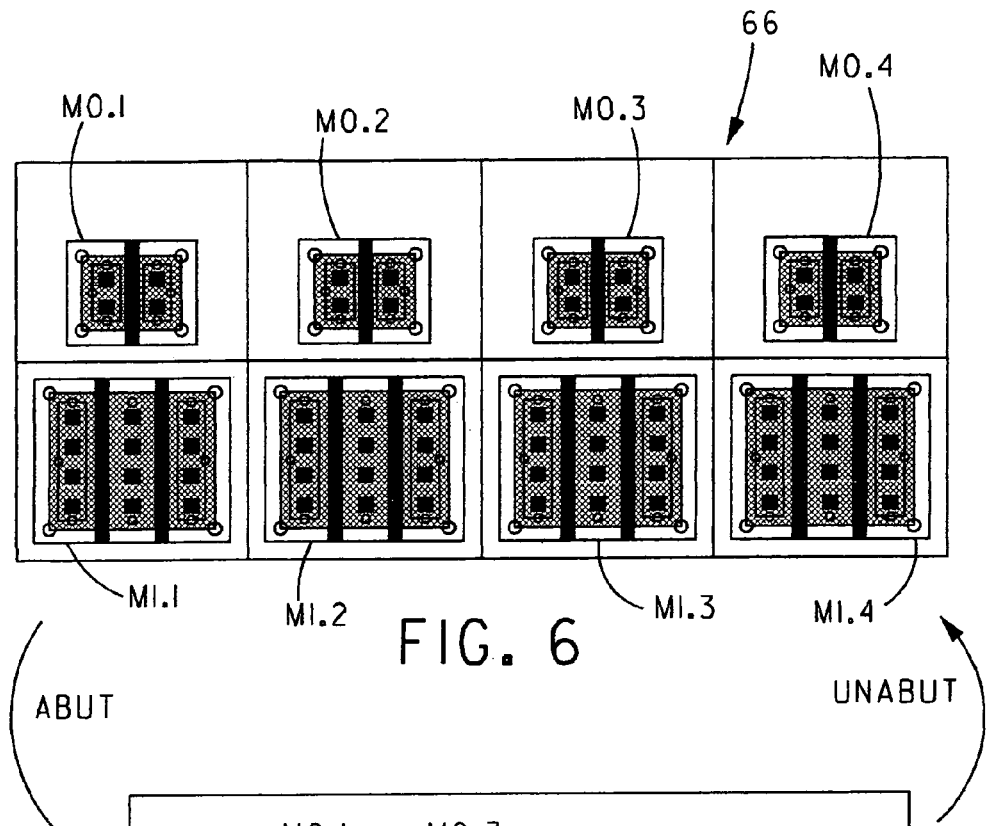
FIG. 6 is another layout view of layout instances of the circuit devices of the circuit of FIG. 2, wherein the layout view includes an array having cells populated with the layout instances of the circuit devices of the circuit of FIG. 2, that can be formed via the layout dialog box in FIG. 3.

FIG. 6 shows a 2×4 array 66 of cells having therein layout instances of circuit devices arranged in an interdigitation pattern of four. Assuming the transistors in the top row of array 66 are four instances of a transistor M0 and the transistors in the bottom row of array 66 are four instances of a transistor M1, array 66 would automatically be generated in response to selecting update button 52 when: pull down menu 38 is set for bottom vertical alignment, pull down menu 40 is set for R0 orientation, and text boxes 30-36 are populated as follows:

InstanceNameTextbox:
M0.1|M0.2|M0.3|M0.4|M1.1|M1.2|M1.3|M1.4;
Number of Rows Text box: 2;
Number of Columns Text box: 4; and
Interdigitate Text box: 4.

Figure 7:
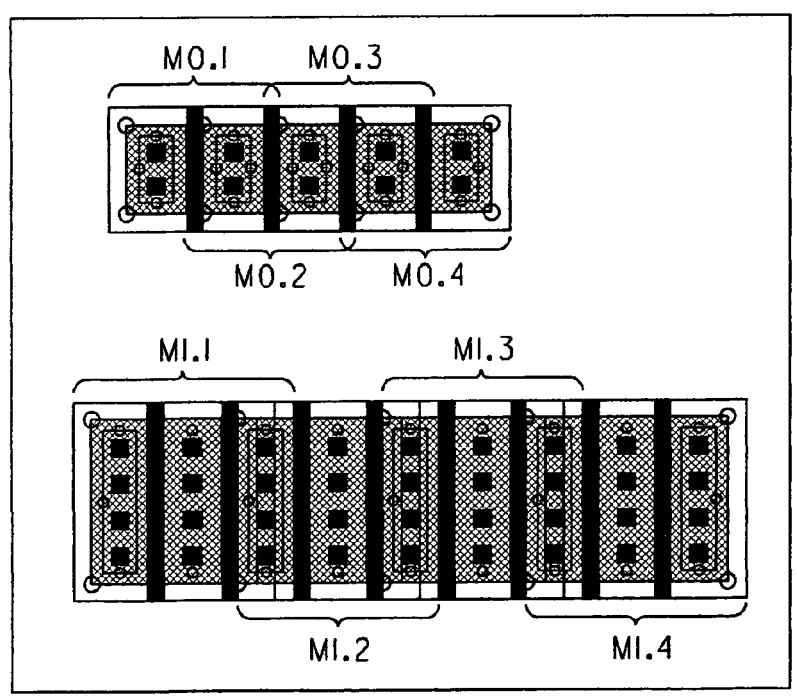
FIG. 7 is a layout view of the layout instances of the circuit devices in FIG. 6 abutted together in response to selection of an abutment option in the layout dialog box of FIG. 3.

If desired, check box 42 of layout dialog box 28 can be selected, for example, using the point-and-click method via mouse 16. In response to selecting check box 42, the layout instances of the circuit devices in each row of array 66 move into an abutting relationship with one another as shown in FIG. 7. Where structure in abutting layout instances of the transistors in FIG. 7 can be shared, selecting check box 42 in layout dialog box 28 causes said layout instances to not only abut, but to also share commonly useable structure. This sharing of commonly usable structure in adjacent layout instances is shown in the transition from the un-abutted state of the layout of instances of the transistors in FIG. 6 to the abutted state of the layout instances of the said transistors in FIG. 7 by the overlapping of structures in adjacent transistors. For example, the left-most structure of the layout instance of transistor M0.2 and the right-most, similar structure in the layout instance of transistor M0.1 in FIG. 6 are made to overlap as shown in FIG. 7 in response to selecting check box 42 in layout dialog box 28.

However, the overlapping of commonly usable structure when abutting layout instances of adjacent circuit devices is not to be construed as limiting the invention since such overlap is either optional, in the case of the transistors shown in FIGS. 6 and 7, or does not result in equivalent electrical performance, e.g., in the case where the circuit devices of adjacent layout instances are, for example, resistors and/or capacitors. In the latter case, selecting check box 42 of layout dialog box 28 would result in the structure of adjacent layout instances of circuit devices in the same row abutting without overlapping.

If the layout instances of the circuit devices have been abutted as shown in FIG. 7, unselecting check box 42 causes the layout instances of the circuit devices to revert back to the un-butted layout shown in FIG. 6.

Figure 8:
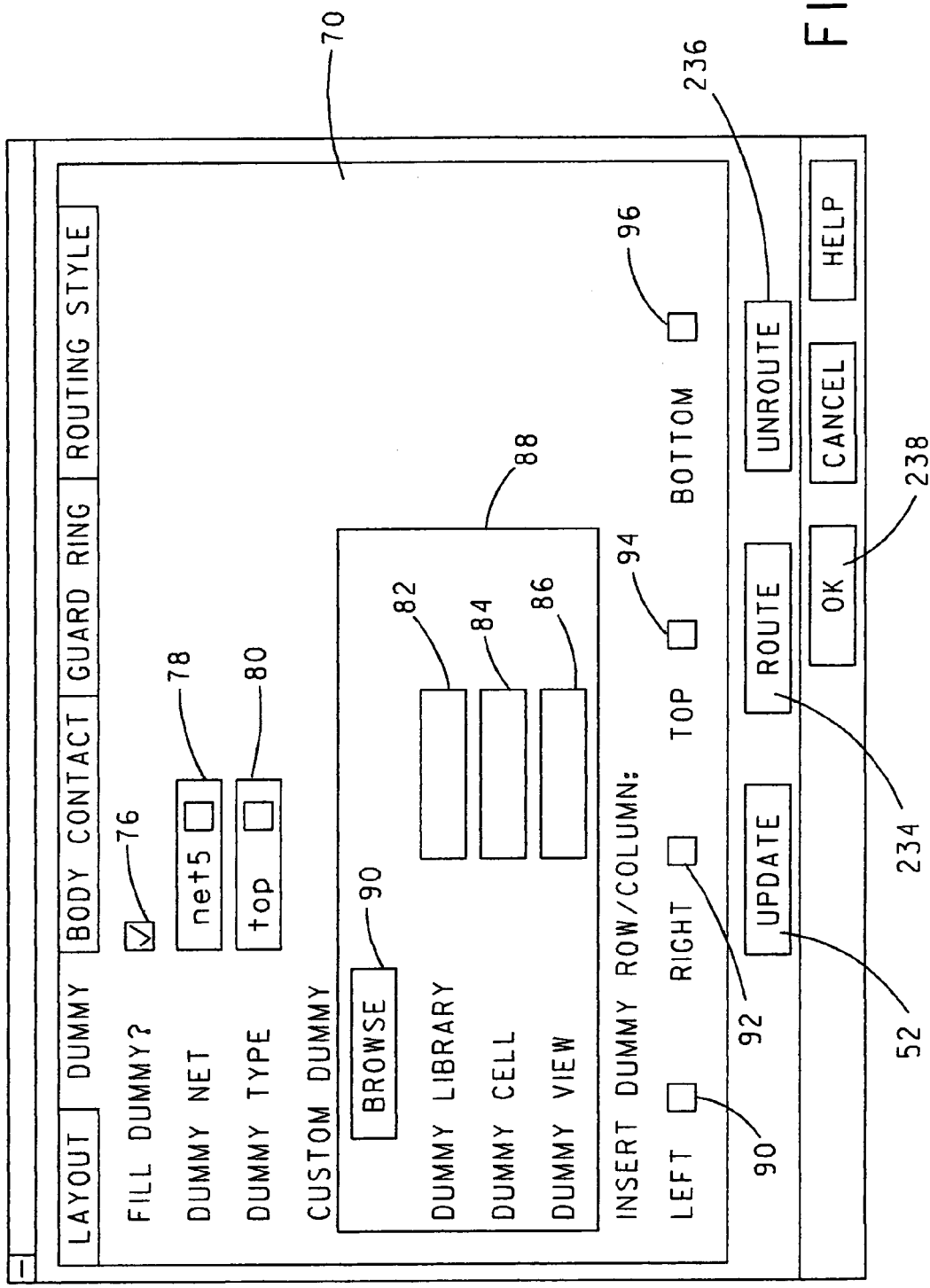
FIG. 8 is a dummy dialog box that can be displayed on the display of the computer shown in FIG. 1 under the control of the computer software of the present invention in connection with the circuit shown in FIG. 2.

With reference to FIG. 8, the computer software of the present invention enables the user thereof to display a "Dummy" dialog box 70 on display 18 in a manner known in the art via input/output system 8. Dummy dialog box 70 enables a user of the computer software of the present invention to insert in an empty cell of an array a desired layout instance of a circuit device or to insert one or more dummy rows and/or dummy columns of layout instances of circuit devices around the array. An exemplary use of dummy dialog box 70 will now be described.

Figure 9:
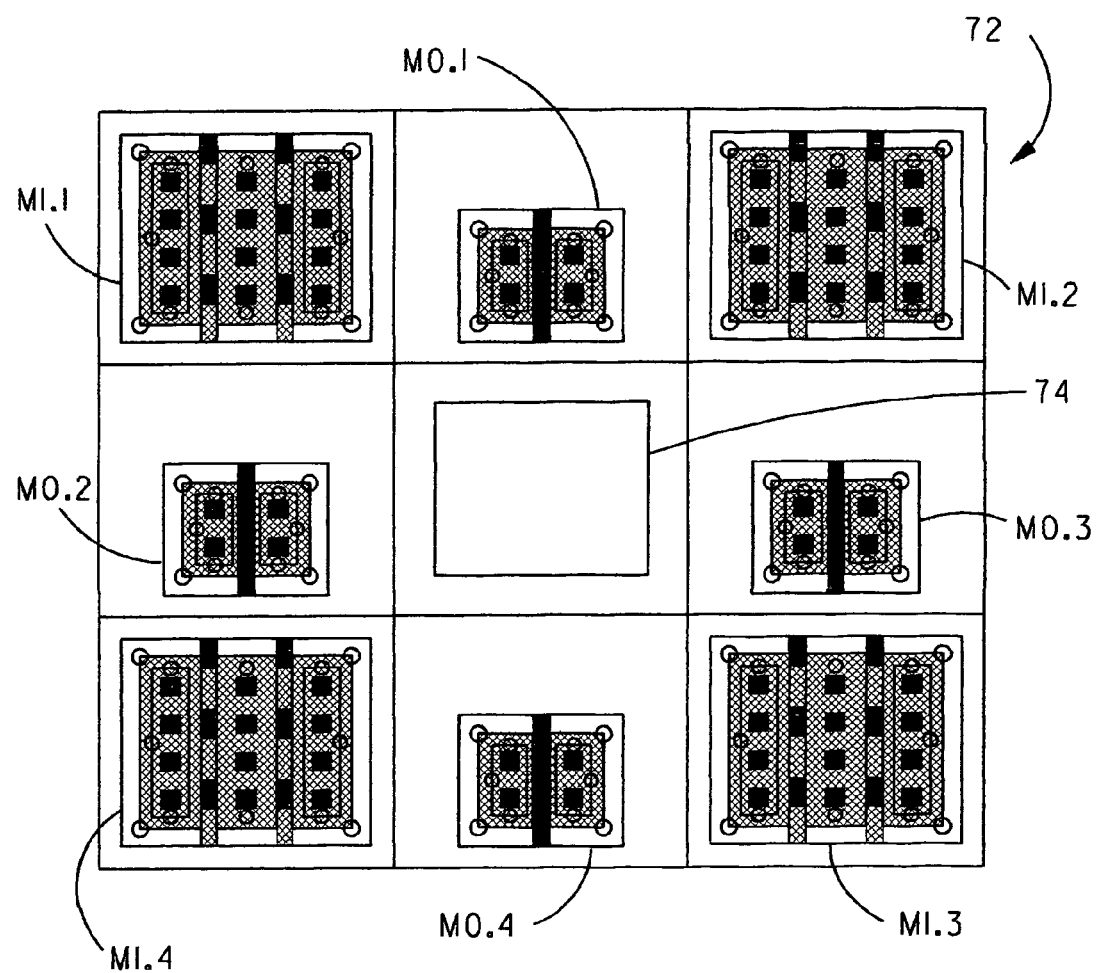
FIG. 9 is a 3×3 array of cells populated with layout instances of the circuit devices of the circuit of FIG. 2, wherein the center cell, being initially unpopulated with a layout instance of a circuit device via the layout dialog box of FIG. 3, can be populated with a dummy layout instance of a circuit device via the dialog box of FIG. 8.

With reference to FIG. 9 and with continuing reference to FIG. 8, when the cells of a 3×3 array 72, formed by the computer software of the present invention in response the user activating update button 52 after entering appropriate data into text boxes 30, 32 and 34 of layout dialog box 28, are either automatically populated, via the computer software of the present invention, or manually populated with layout instances of transistors M0 and M1 in a manner shown in FIG. 9, whereupon a cell of array 72 is unpopulated, e.g., for reasons of symmetry, it is often desirable to include a dummy layout instance 74 of a circuit device in the empty cell and to connect said dummy layout instance 74 to a suitable electrical distribution network configured to distribute a suitable electrical potential, e.g., power or a ground reference, to dummy layout instance 74. One reason for inserting a dummy layout instance 74 in a cell of an array is to minimize parasitic effects on adjacent layout instances of circuit devices that would occur in the absence of the dummy layout instance 74.

In order to insert and connect dummy layout instance 74 to a suitable electrical distribution network in array 72, a user selects "Fill dummy?" check box 76 in dummy dialog box 70, makes an appropriate selection of the electrical distribution network that dummy layout instance 74 is connected to via "Dummy Net" pull down menu 78 and selects the specific layout instance of a circuit device to comprise dummy layout instance 74 via "Dummy Type" pull down menu 80. Examples of networks that can be connected to dummy layout instance 74 include a ground reference, a voltage reference, e.g., Vcc, and none. Each such network can be assigned based on a name associated with the network, e.g., net5=ground reference. Dummy types available via pull down menu 80 can include: left, right, top, bottom, upper left diagonal, upper right diagonal, lower left diagonal and lower right diagonal. Selecting "top" in pull down menu 80 causes the computer software of the present invention to reproduce a copy of M0 as dummy layout instance 74 in array 72. Similarly, selecting "upper left diagonal" in pull down menu 80 causes an instance of transistor M1 to be reproduced as dummy layout instance 74 in array 72.

If desired, pull down menu 80 can also include a "custom dummy" selection. In response to selecting "custom dummy" in pull down menu 80, text boxes 82, 84 and 86 of custom dummy dialog box 88 become active. Custom dummy dialog box 88 enables a user to select the layout instance of a circuit device to populate dummy layout instance 74 in array 72 by directly entering appropriate data into text boxes 82-86 regarding the location in storage 6, media drive 10 or storage medium 12 where the file resides that contains said layout instance. If, however, the location of the file containing the layout instance desired to be inserted into dummy layout instance 74 is not known, the user can select a Browse button 90 of custom dummy dialog box 88 to search storage 6, media drive 10 and/or storage medium 12 for the file containing the layout instance of the circuit device to be included as the dummy layout instance 74 of array 72 in a manner well-known in the art to those familiar with the Microsoft Windows® operating system.

Figure 10:
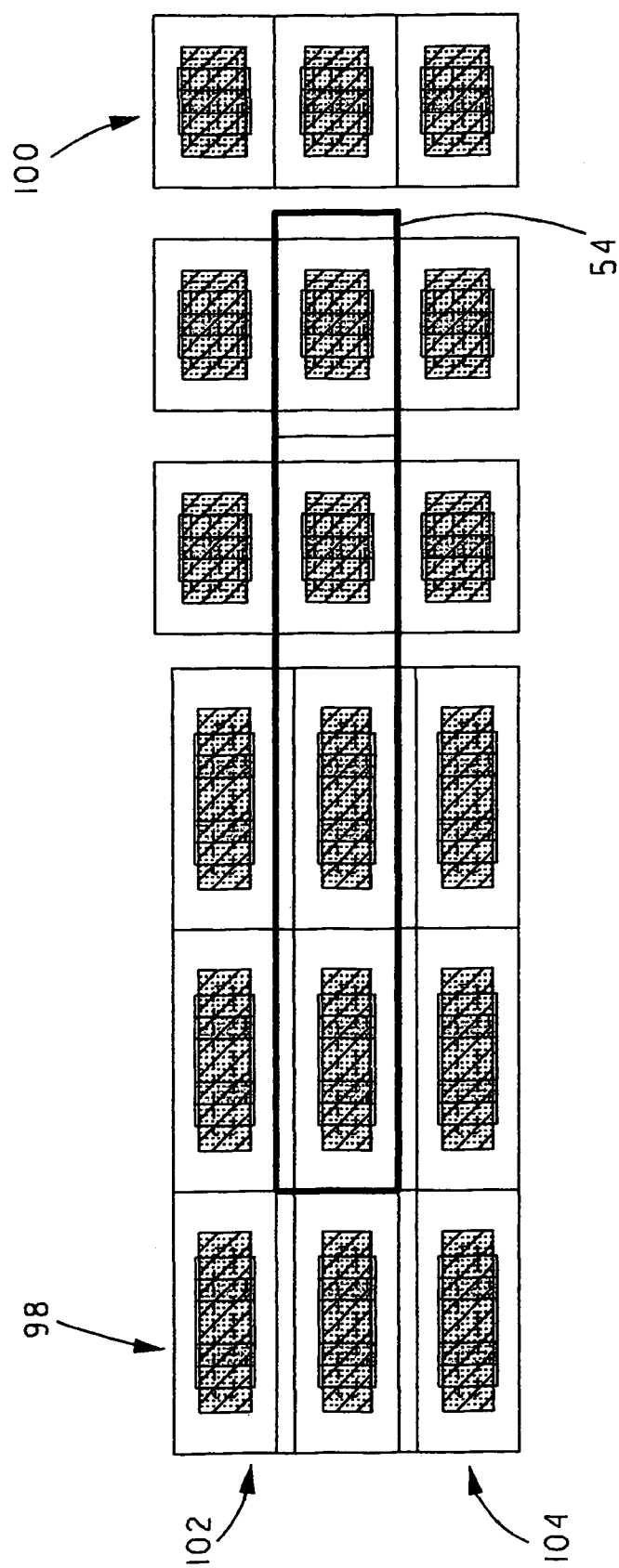
FIG. 10 is the array of FIG. 4 surrounded by dummy rows and dummy columns added to the array of FIG. 4 via the dummy dialog box of FIG. 8, wherein each cell of each dummy row or dummy column is populated with a dummy layout instance of a circuit device.

Also or alternatively, it may be desirable to insert one or more dummy rows and/or dummy columns around the periphery of an array. An example of inserting dummy rows and columns around the periphery of an array will be described with reference to FIG. 10, array 54 of FIG. 4 and with continuing reference to FIG. 8. In FIG. 10, array 54 is shown centered in the layout. If it is desired to add dummy rows and/or dummy columns to the left, right, top and/or bottom of array 54, check boxes 90, 92, 94 and/or 96, respectively, of dummy dialog box 70 are selected by the user.

FIG. 10 shows the layout of array 54 and the dummy rows 102, 104 and dummy columns 98, 100 that would be produced by the computer software of the present invention in response to selecting each of check box 90-96. Desirably, the devices of each dummy row are copies of the devices in the adjacent row and the devices in each dummy column are copies of the devices in the adjacent column. However, this is not to be construed as limiting the invention since it is envisioned that the devices included in each dummy row and/or each dummy column can be selected in any suitable and/or desirable manner.

If check boxes 92-96 are selected but check box 90 is not selected, the left-most column 98 of the layout shown in FIG. 10 would not be generated. If check boxes 90, 94 and 96 are selected but check box 92 is not selected, the right-most column 100 of the layout shown in FIG. 10 would not be reproduced. If check boxes 90, 92 and 96 are selected but check box 94 is not selected, the top-most row 102 of the layout shown in FIG. 10 would not be produced. If check boxes 90, 92 and 94 are selected but check box 96 is not selected, the bottom-most row 104 of the layout shown in FIG. 10 would not be produced. Similarly, if any check box 90-96 is selected but the remaining check boxes are not selected, the row and/or column associated with each non-selected check box would not be reproduced in the layout shown in FIG. 10.

Desirably, each dummy layout instance, dummy row and/or dummy column selected in dummy dialog box 70 is instantiated in response to the user selecting update button 52. However, this is not to be construed as limiting the invention since the insertion of a dummy device, dummy row and/or dummy column can be accomplished in any suitable and/or desirable manner once sufficient information about the insertion is known to the computer program of the present invention. For example, for the insertion of a dummy layout instance, once suitable selections have been made in check box 76 and pull down menu(s) 78 and/or 80, the dummy layout instance can be inserted into an empty cell of the corresponding array. Similarly, in response to selection of check box 90, 92, 94 or 96, an instance of the row or column of the corresponding dummy array is produced at the appropriate location around the array.

Figure 11:
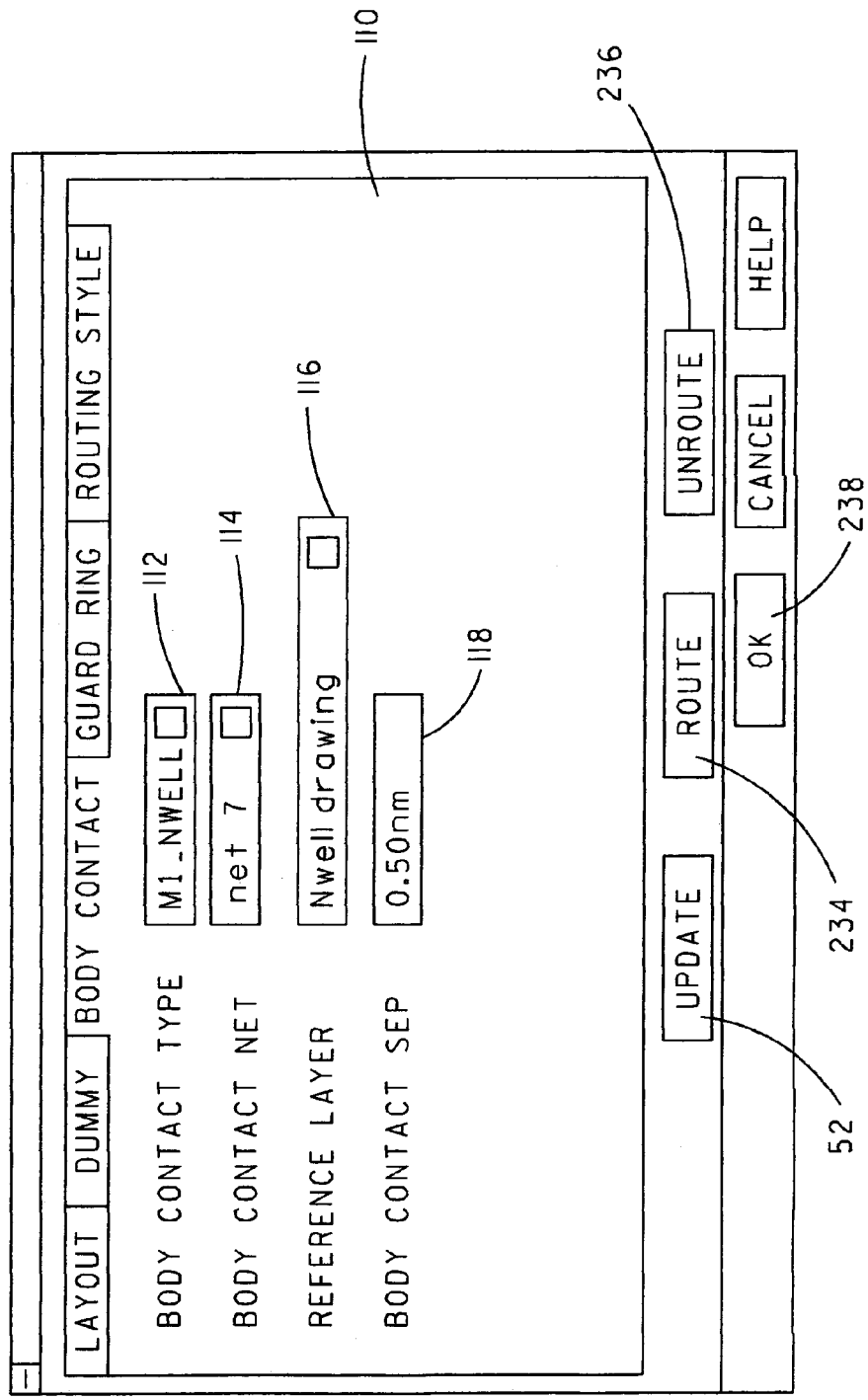
FIG. 11 is a body contact dialog box that can be displayed on the display of the computer of FIG. 1 under the control of the computer software of the present invention in connection with the circuit shown in FIG. 2.
Figure 12:
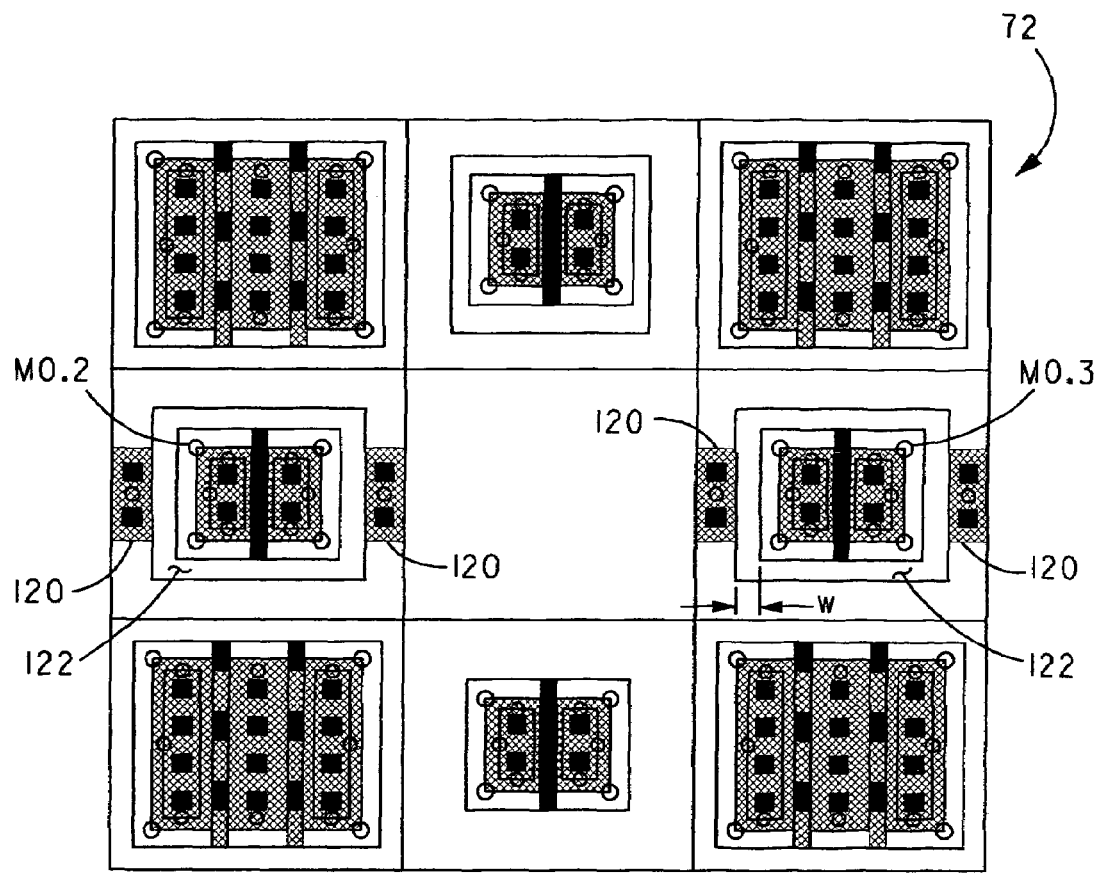
FIG. 12 is a 3×3 array populated with layout instances of the circuit devices of the circuit of FIG. 2 via the layout dialog box of FIG. 3, wherein the layout instances populating the middle row of the 3×3 array include body contacts added thereto via the body contact dialog box of FIG. 11.

With reference to FIG. 11, the computer software of the present invention enables the user thereof to display a "Body Contact" dialog box on display 18 in a manner known in the art via input/out system 8. Dialog box 110 includes a "Body Contact Type" pull down menu 112, a "Body Contact Net" pull down menu 114, a "Reference Layer" pull down menu 116 and a "Body Contact Sep" (aration) text box 118. Pull down menu 112 enables the user to select a desired body contact type from a list of available body contact types. Pull down menu 114 enables the user to select from a list of electrical distribution networks, the electrical distribution network to which each body contact is connected. Pull down menu 116 enables the user to select from a list of layers of the corresponding layout instance of the circuit device the layer to which the body contact is connected. Non-limiting examples of typical layers of a layout instance of a circuit device known to those skilled in the art of integrated circuit design include a first metal layer, a second metal layer, a polysilicon layer, and the like. Lastly, text box 118 enables the user to specify how far each body contact is to be placed away from the layout instance of the corresponding circuit device. An example of the placement of body contacts 120 on opposite sides of transistors M0.2 and M0.3 of array 72 in FIG. 9 is shown in FIG. 12. To ensure proper separation between each body contact 120 and its corresponding transistor, a boundary box 122 is formed around each transistor M0.2 and M0.3, with the body contacts 120 of each transistor being placed outside of said boundary box 122. The width w of boundary box 122 corresponds to the data (dimension) entered into text box 118.

In FIG. 12, body contacts 120 are illustrated as being placed on opposite sides of transistors M0.2 and M0.3. Also or alternatively, body contacts can be placed on the top and bottom of each transistor. Routinely, body contacts are placed symmetrically on opposite sides and/or opposite ends of the corresponding layout instance of a circuit device. However, this is not to be construed as limiting the invention since it is envisioned that body contacts can be placed non-symmetrically around a layout instance of a circuit device if desired.

Desirably, each body contact 120 is placed in response to the user selection of update button 52. However, this is not to be construed as limiting the invention. The selection of each layout instance of a circuit device that is to receive one or more body contacts 120 can be made in any manner known in the art. For example, the user can select one or more cells of array 72 in any suitable and/or desirable manner for receiving body contacts 120 in response to selecting update button 52 after the selection of appropriate data in body contact dialog box 110. Desirably, one of the selections of pull down menu 112 is "none" to indicate that no body contact type is desired.

Figure 13:
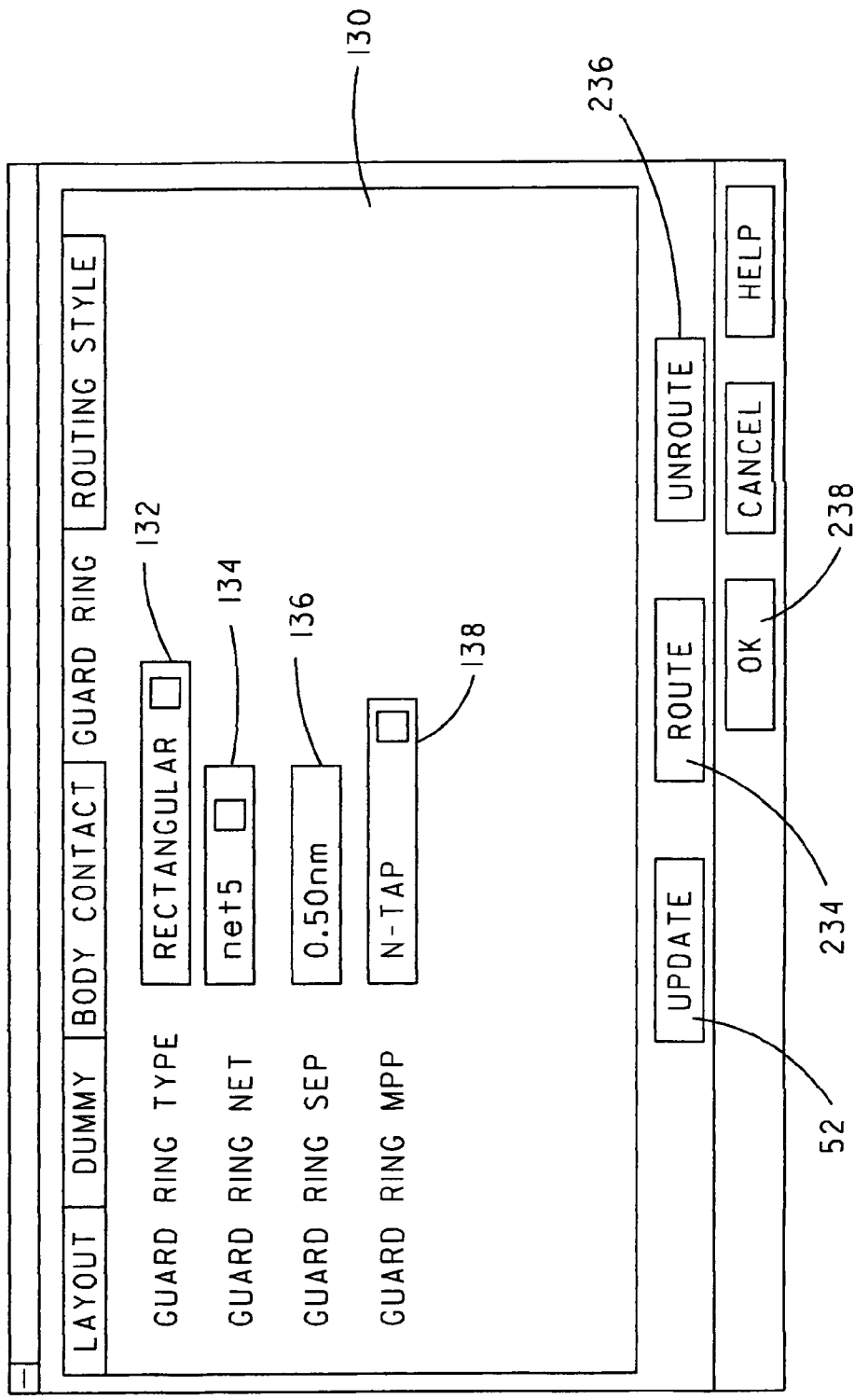
FIG. 13 is a guard ring dialog box that can be displayed on the display of the computer of FIG. 1 under the control of the computer software of the present invention in connection with the circuit shown in FIG. 2.

With reference to FIG. 13, the computer software of the present invention enables the user thereof to display a "Guard Ring" dialog box 130 on display 18 in a manner known in the art via input/output system 8. Guard ring dialog box 130 includes a "Guard Ring Type" pull down menu 132, a "Guard Ring Net" pull down menu 134, a "Guard Ring Sep" (aration) text box 136 and a "Guard Ring MPP" pull down menu 138.

Figure 14:
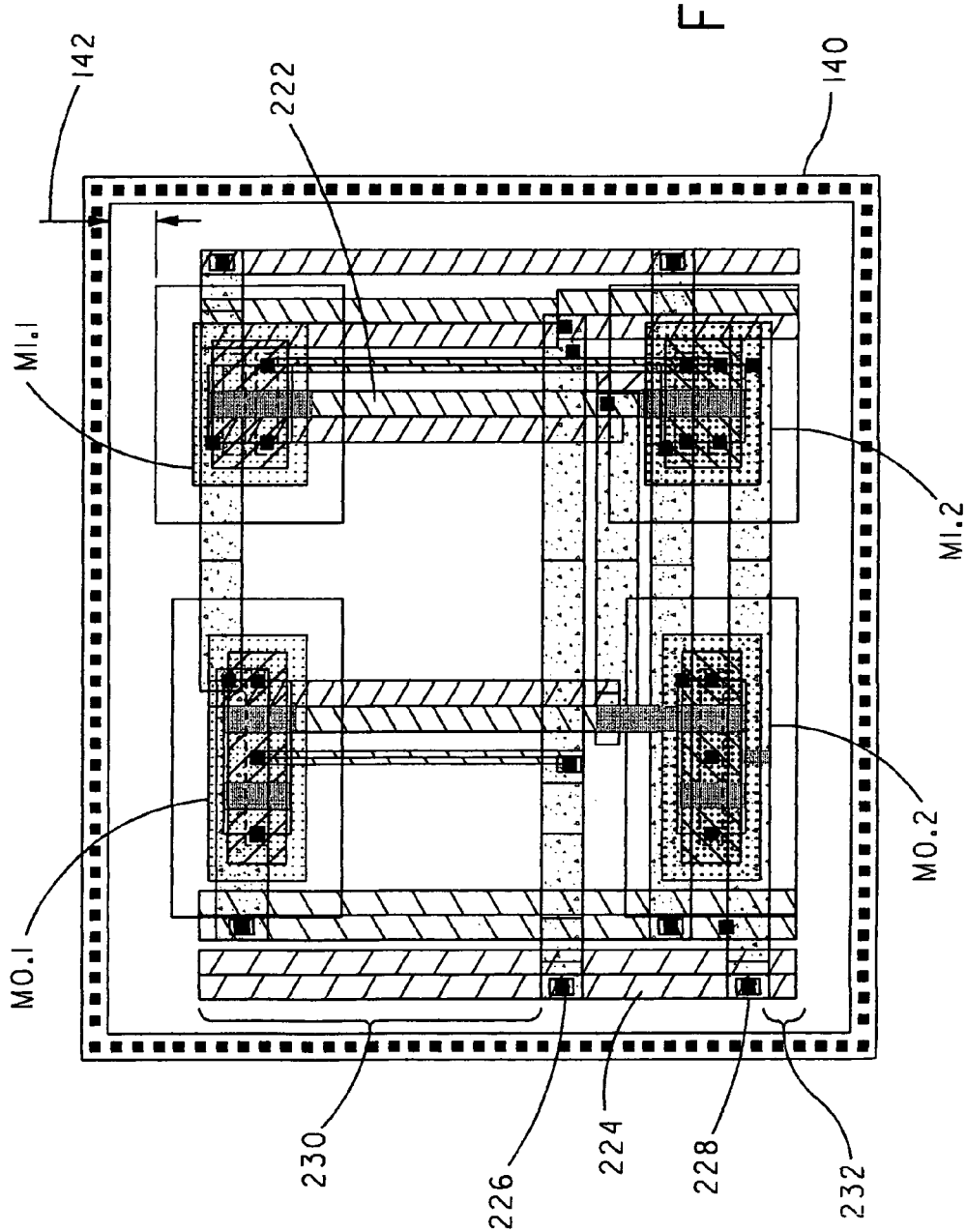
FIG. 14 is a view of the layout instances of the circuit devices of the circuit of FIG. 2 after routing enclosed by a guard ring added via the guard ring dialog box of FIG. 11.

With reference to FIG. 14 and with continuing reference to FIG. 13, pull down menu 132 includes a list of user selectable geometries of a guard ring 140 to surround an array having one or more layout instances of circuit devices included in cell(s) thereof. Exemplary, non-limiting geometries include: rectangle, conformal, or none when no guard ring is desired. The user can select a desired guard ring type from this list in any suitable and/or desirable manner known in the art.

Pull down menu 134 includes a user selectable list of electrical distribution networks to which to connect guard ring 140. Examples of suitable electrical distribution networks that can be selected by the user include: ground reference, electrical power, such as Vcc, and the like. The user can select a desirable one of the electrical distribution networks from the pull down menu in any suitable and/or desirable manner known in the art. If desired, each electrical network can be assigned a suitable descriptive name in pull down menu 134.

The user can enter into text box 136 a suitable distance value for the distance between the farthest outside physical structure of the one or more layout instances of circuit devices to be surrounded by the guard ring and/or the routing (discussed hereinafter) connecting said one or more layout instances. An exemplary guard ring separation 142 is shown in FIG. 14.

Lastly, pull down menu 138 includes a list of user selectable guard ring configurations. Each guard ring configuration includes a desired layout of conductive material(s) forming the corresponding guard ring 140. Desirably, each guard ring configuration has a unique layout and/or geometry of conductive material(s). However, this is not to be construed as limiting the invention.

Desirably, the computer software of the present invention forms guard ring 140 around a selected array in response to the user selecting update button 52. However, this is not to be construed as limiting the invention.

Figure 15:
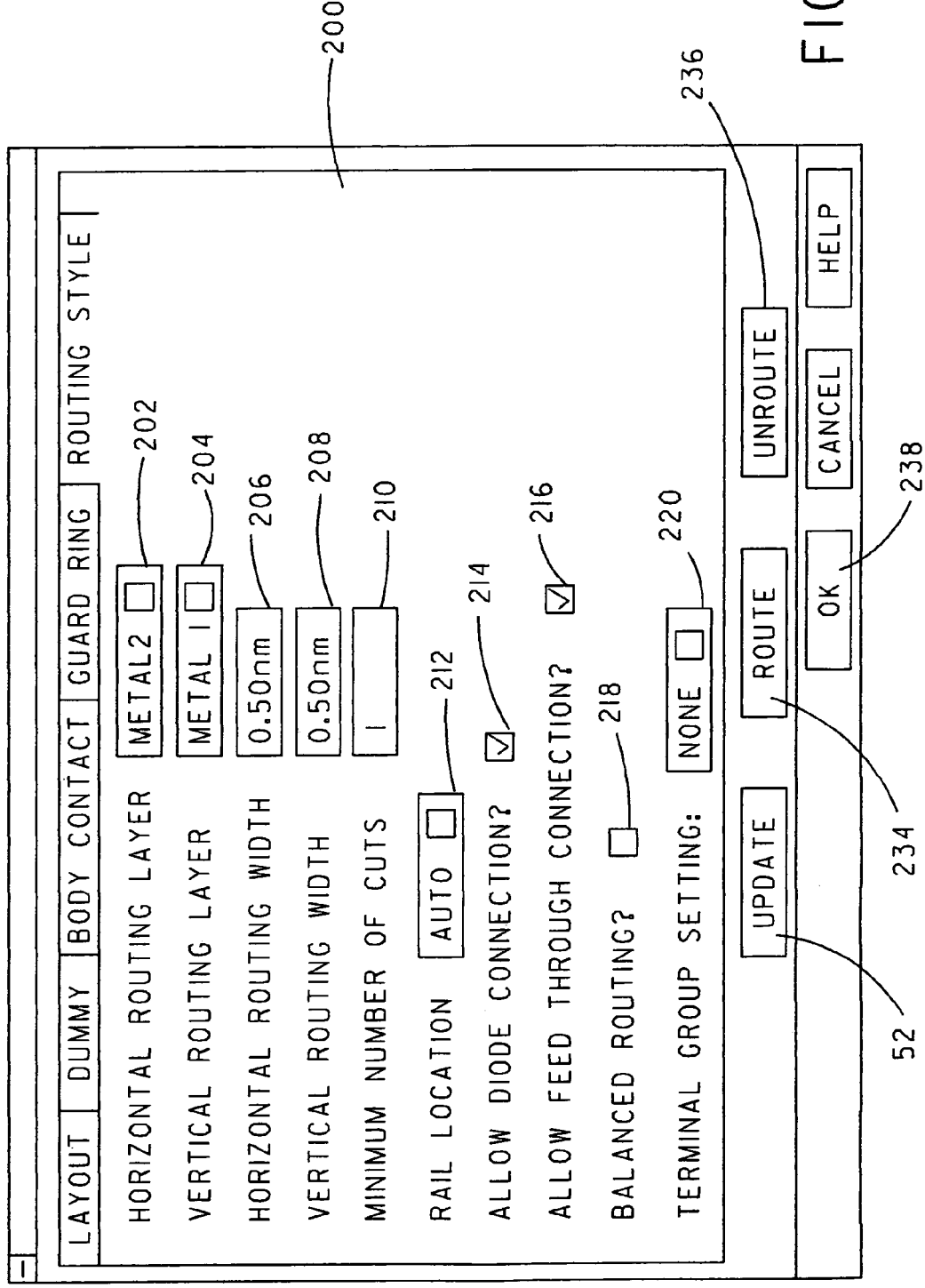
FIG. 15 is a routing style dialog box that can be displayed on the display of the computer of FIG. 1 under the control of the computer software of the present invention in connection with the circuit shown in FIG. 2.

Lastly, with reference to FIG. 15, the computer software of the present invention enables the user thereof to display a "Routing Style" dialog box 200 in a manner known in the art via input/out system 8. Routing style dialog box 200 includes a "Horizontal Routing Layer" pull down menu 202 and a "Vertical Routing Layer" pull down menu 204. Pull down menus 202 and 204 can be utilized for selecting which layer of the layout instances of the circuit devices contain horizontal routing and vertical routing, respectively.

Routing style dialog box 200 also includes "Horizontal Routing Width" and "Vertical Routing Width" text boxes 206 and 208 for receiving from the user via input/output system 8 the minimum width of each line of the horizontal and vertical routing, respectively.

A "Minimum Number of Cuts" text box 210 facilitates user entry of the minimum number of via connections formed between lines in the horizontal and vertical routing layers. By default, the minimum number of cuts is one.

A "Rail Location" pull down menu 212 enables the user to select the location of a rail, such as an electrical power distribution network, on the right, left, top or bottom, or some combination thereof of the array to which the routing is to be applied.

An "Allow Diode Connection" check box 214 enables the user to select whether the computer software of the present invention connects certain transistors that may not be required for the overall operation of the circuit in a manner to function as a diode. For example, where only one transistor of a pair of transistors is needed to provide a desired amount of gain, the user selecting check box 214 will cause the computer software of the present invention to connect the other transistor in the manner of a diode, e.g., connect the gate to either the drain or the source, such that said transistor operates as a diode.

An "Allow Feed Through Connection" check box 216 of routing style dialog box 200 enables the user to select whether to connect the polysilicon layers of layout instances in adjacent rows. An exemplary feed through connection 222 is shown in FIG. 14 connecting the polysilicon layers of the layout instances of the upper right and lower right transistors.

A "Balanced Routing?" check box 218 enables the user to select whether or not so-called "balanced routing" is desired or not. Absent selecting the balanced routing check box 218, vertical routing between vertically aligned contacts will only extend between the contacts, or slightly beyond. In contrast, when the balanced routing check box 218 is selected, the vertical routing between vertically aligned contacts will extend the entire vertical length between vertically aligned layout instances of circuit devices. For example, the selection of the balanced routing check box 218 in FIG. 15 causes routing line 224 in FIG. 14 to extend beyond contacts 226 and 228. The additional lengths of routing line 224 that are generated in response to the user selecting check box 218 are noted by reference numbers 230 and 232.

Lastly, a "Terminal Group Setting" pull down menu 220 enables the user to select one of a number of predefined terminal or contact groups to be defined around the array being routed. One such selection can include "none" whereupon the computer software of the present invention will not include any special arrangement of terminals or contacts. In contrast, in response to selecting a particular terminal or contact group setting, the computer software of the present invention will generate a layout of terminals or contacts around the array being routed according to layout data contained in a file corresponding to the selected terminal group setting. For example, one terminal group setting can include forming terminals or contacts uniformly around the periphery of the array being routed. However, this is not to be construed as limiting the invention.

The selections made or data entered by the user in Routing Style dialog box 200 can be implemented in response to the user selecting Route button 234. For example, if the selections made and data entered by the user into Routing Style dialog box 200 were done in connection with array 60 shown in FIG. 5, in response to the user selecting route button 234, the computer software of the present invention would automatically route the connections between the terminals of transistors M0.1, M0.2, M1.1 and M1.2 as shown in FIG. 14. It should be noted, that when routing, the computer software of the present invention can adjust the vertical spacing between layout instances of circuit devices in the same column if necessary, but will retain the horizontal spacing between adjacent layout instances of circuit devices in the same row. To this end, if devices in the same row were made to abut by the selection of check box 42 in Layout dialog box 28, the selection of Route button 234 would cause the computer software of the present invention to create the routing between devices while maintaining the desired abutment.

An Unroute button 236 can be provided to enable the user to unroute the connecting lines between layout instances of the circuit devices in an array. For example, in response to selecting the unroute button in connection with the routed layout instances of the circuit devices shown in FIG. 14, the layout instances of the circuit devices would revert to their original positions shown in FIG. 5, but within the guard ring 140 shown in FIG. 14.

Desirably, if guard ring 140 is selected before the user selects route button 234, the dimensions of guard ring 140 will increase to facilitate the introduction of routing between the layout instances of the circuit devices contained within guard ring 140 while maintaining appropriate spacing between guard ring 140 and any structure of the routed layout instances of the circuit devices contained within guard ring 140.

When a satisfactory design of layout elements of circuit devices has been completed, e.g., the layout instances of the circuit devices have been routed and a guard ring, if desired, has been formed around the routed devices, the user can select OK button 238 whereupon the computer software of the present invention will save the design data in a file in storage 6, media drive 10 and/or storage medium 12 under a name entered by the user into a "Name" text box 240 of layout dialog box 28. This saved design can then be retrieved in any suitable time and utilized as is or modified by way of the various dialog boxes discussed above to create a new design.

A circuit design created in the above-described manner can be used with one or more other circuit designs, created in the same manner or in any other manner, that are also stored in storage 6, media drive 10 and/or storage medium 12. For example, the circuit design shown in FIG. 14 can be included in a cell of a larger circuit to enable the user to create larger more complex circuit designs based upon previously designed circuits or sub-circuits. Also or alternatively, each circuit created in the above-described manner can be imported into a new circuit as a subset thereof and be merged together with other sub-circuits to create a higher level circuit. Accordingly, the above-described uses of circuits formed in the above-described manner are not to be construed as limiting the invention since it is envisioned that such predesigned circuits can be utilized in any suitable and/or desirable manner.

As can be seen, the present invention enables the efficient creation of circuits with minimal user input. The present invention avoids a circuit designer user from having to design elements of a circuit design by providing a series of dialog boxes that enable the user to select, among other things, the type of array utilized to layout the layout instances of the circuit devices, the interdigitation pattern of layout instances of circuit devices that are used multiple times, the use of dummy layout instances of circuit elements and/or dummy rows/columns, the selection of optional body contacts for one or more layout instances of circuit devices, the use of an optional guard ring around the circuit devices of an array, as well as the desired routing style. To facilitate proper layout of layout instances of circuit devices in an array, the computer software of the present invention desirably enables the user to move layout instances of circuit devices to different cells in the array utilizing any suitable and/or desirable technique, such as the click and drag method via input/output system 8.

In the accompanying drawings, the dimensions of the various instances of transistors M0 and M1 are not to be construed as limiting the invention in any manner. Moreover, the fact that like named layout instances of transistors M0 and M1 in the various figures have different dimensions is not to be construed as limiting the invention in any manner since the descriptors "M0" and "M1" are simply for the purpose of describing the present invention.

The present invention has been described with reference to the preferred embodiment. Obvious modifications and alterations will occur to others upon reading and understanding the preceding detailed description. For example, while the present invention has been described in connection with the use of dialog boxes in a windows environment, it is to be appreciated that all of the data entry into text boxes, the selections made in check boxes and/or the selections made via pull down menus can be implemented via command line mode instead of the disclosed windows environment. For example, the computer software of the present invention can prompt a user to enter into a command line the names of one or more data pointers corresponding to data pointers entered into text box 30 in FIG. 3. Accordingly, although the invention has been described in connection with the use of dialog boxes in a windows environment, the present invention is not to be construed as so limited. It is intended that the invention be construed as including all such modifications and alterations insofar as they come within the scope of the appended claims or the equivalents thereof.

The invention claimed is:

1. A computer implemented method of device layout in an integrated circuit design comprising:
   (a) providing an array having a selectable number of rows and columns of cells;
   (b) displaying on a display of the computer a schematic view of a plurality of interconnected circuit devices comprising a circuit, wherein said schematic view does not include a physical arrangement of material(s) forming the circuit devices comprising the circuit; and
   (c) populating an empty cell of the array with a corresponding layout instance of a circuit device upon selection of the circuit device in the schematic view, wherein each layout instance represents the physical arrangement of material(s) that form the corresponding selected circuit device.

2. The method of claim 1, wherein step (c) includes populating one or more of the cells of the array as a function of a selected interdigitation pattern.

3. The method of claim 1, wherein the plurality of circuit devices displayed in the schematic view includes one or more transistors, one or more capacitors and/or one or more resistors.

4. The method of claim 1, further including displaying the array including the layout instance of a selected circuit device in at least one cell thereof on the display.

5. The method of claim 4, further including moving, via an input/output system of the computer, a layout instance in the displayed array from one cell in the array to another cell in the array.

6. The method of claim 1, further including at least one of:
   via an input/output system of the computer, causing at least one electrical connection to be routed between at least two terminals of the layout instances populating the array based on one or more predetermined routing rules; and
   via the input/output system, causing an electrical distribution network to be formed in proximity to the layout instances populating the array.

7. The method of claim 1, wherein the array includes at least one unpopulated cell when all of the desired layout instances have been populated into the array.

8. The method of claim 1, further including at least one of:
   via an input/output system of the computer, causing all of the layout instances in the array to be aligned to the top, center or bottom of their respective cells;
   via the input/output system, causing a change in a rotational orientation of at least one layout instance in its respective cell;
   via the input/output system, causing a change in a rotational orientation of the populated array; and
   via the input/output system, causing layout instances in two or more adjacent cells to abut or unabut.

9. The method of claim 1, further including:
   via an input/output system of the computer, causing at least one dummy row or column to be inserted adjacent a row or column of the array at the periphery of the array; and
   causing each cell of the inserted dummy row or column to be populated with either the layout instance of the cell in the adjacent row or column or a user selected layout instance.

10. The method of claim 9, further including causing, via the input/output system, at least one terminal of each layout instance populating a dummy row or column to be connected to an electrical distribution network formed in proximity to the array, wherein the electrical distribution network is configured to distribute either electrical power or a ground reference.

11. The method of claim 1, further including causing a body contact to be inserted adjacent each of one or more sides of a layout instance.

12. The method of claim 1, further including causing a guard ring to form around the array in contact with a ground reference.

13. An apparatus for laying out devices of an integrated circuit design comprising:
   means for selecting a desired x-y array of cells;
   means for displaying a diagrammatic view of a plurality of interconnected circuit devices that does not include a physical arrangement of material(s) forming the circuit devices;
   means for enabling a user to select a plurality of the circuit devices in the diagrammatic view; and
   means responsive to the selection of the plurality of circuit devices in the diagrammatic view for populating each of a like plurality of empty cells of the array with a layout instance of one of the selected circuit devices, wherein each layout instance represents a physical arrangement of material(s) that form the corresponding selected circuit device.

14. The apparatus of claim 13, further including means for selecting an interdigitation pattern for layout instances of the array, wherein the means for populating populates one or more of the cells of the array as a function of the selected interdigitation pattern.

15. The apparatus of claim 13, wherein the circuit devices displayed in the diagrammatic view include one or more transistors, one or more capacitors and/or one or more resistors.

16. The apparatus of claim 13, further including means for displaying the array with at least one cell thereof including a layout instance of a selected circuit device.

17. The apparatus of claim 16, further including means for moving a layout instance in the displayed array from one cell of the array to another cell of the array.

18. The apparatus of claim 13, further including at least one of:
- means for routing at least one electrical connection between at least two terminals of the layout instances populating the array based on one or more routing rules; and
- means for forming an electrical distribution network in proximity to the layout instances populating the array.

19. The apparatus of claim 13, wherein the array includes at least one unpopulated cell when all of the desired layout instances have been populated into the array.

20. The apparatus of claim 13, further including at least one of:
- means for aligning all of the layout instances to the top, center or bottom of their respective cells;
- means for rotating at least one layout instance in its respective cell;
- means for rotating the populated array; and
- means for abutting or unabutting layout instances in two or more adjacent cells.

21. The apparatus of claim 13, further including:
- means for inserting at least one dummy row or column adjacent a row or column of the array at the periphery of the array; and
- means for populating each cell of the inserted dummy row or column with either the layout instance of the cell in the adjacent row or column or a user selected layout instance.

22. The apparatus of claim 21, further including means for connecting at least one terminal of each layout instance populating a dummy row or column to an electrical distribution network formed in proximity to the array, wherein the electrical distribution network is configured to distribute either electrical power or a ground reference.

23. The apparatus of claim 13, further including means for inserting a body contact adjacent each of one or more sides of a layout instance.

24. The apparatus of claim 23, further including:
- means for forming a guard ring around the array; and
- means for connecting the guard ring to an electrical distribution network configured to distribute a ground reference.

* * * * *